(12) United States Patent
Houlihane et al.

(10) Patent No.: US 7,496,813 B1
(45) Date of Patent: Feb. 24, 2009

(54) COMMUNICATING SIMULTANEOUSLY A FUNCTIONAL SIGNAL AND A DIAGNOSTIC SIGNAL FOR AN INTEGRATED CIRCUIT USING A SHARED PIN

(75) Inventors: Thomas Sean Houlihane, Bassingbourn (GB); George James Milne, Rampton (GB)

(73) Assignee: ARM Limited, Cambridge (GB)

( * ) Notice: Subject to any disclaimer, the term of this patent is extended or adjusted under 35 U.S.C. 154(b) by 389 days.

(21) Appl. No.: 11/289,640

(22) Filed: Nov. 30, 2005

(51) Int. Cl.
*G01R 31/28* (2006.01)

(52) U.S. Cl. .......... 714/724; 714/25; 714/30; 714/709; 714/731; 714/734; 714/740; 714/744; 714/812; 714/814; 713/500; 702/190; 703/28

(58) Field of Classification Search .......... None
See application file for complete search history.

(56) References Cited

U.S. PATENT DOCUMENTS

| | | | | |
|---|---|---|---|---|
| 5,953,273 A | * | 9/1999 | Ikegami | 365/201 |
| 5,991,910 A | * | 11/1999 | Hull et al. | 714/733 |
| 6,075,396 A | * | 6/2000 | Amerian et al. | 327/198 |
| 6,076,175 A | * | 6/2000 | Drost et al. | 714/704 |
| 6,466,007 B1 | * | 10/2002 | Prazeres da Costa et al. | 324/158.1 |
| 6,800,817 B2 | * | 10/2004 | Schneider et al. | 714/733 |
| 6,834,367 B2 | * | 12/2004 | Bonneau et al. | 714/738 |
| 7,089,467 B2 | * | 8/2006 | Burch | 714/724 |
| 7,143,312 B1 | * | 11/2006 | Wang et al. | 714/30 |
| 7,187,192 B2 | * | 3/2007 | Oshima et al. | 324/765 |
| 7,330,502 B2 | * | 2/2008 | Hotta | 375/221 |

OTHER PUBLICATIONS

"Integrator LM-XCV600E User Guide", 2001, http://arm.com/.*

* cited by examiner

*Primary Examiner*—John P Trimmings
(74) *Attorney, Agent, or Firm*—Nixon & Vanderhye P.C.

(57) ABSTRACT

An integrated circuit 2 including functional circuits 4, 6 and a diagnostic circuit 10 passes a functional signal and a diagnostic signal to/from the integrated circuit using a shared integrated circuit pin 14. The functional signal and the diagnostic signal have relative forms such that they can be simultaneously communicated and respective independent physical communication channels provided therefore. Examples are the diagnostic signal being used to frequency, phase, amplitude or otherwise modulate a functional signal being passed. A diagnostic interface circuit 18 is provided to recover the diagnostic signal from the combined functional and diagnostic signal or to combine the functional and diagnostic signals.

17 Claims, 5 Drawing Sheets

COMMUNICATING SIMULTANEOUSLY A FUNCTIONAL SIGNAL AND A DIAGNOSTIC SIGNAL FOR AN INTEGRATED CIRCUIT USING A SHARED PIN

BACKGROUND OF THE INVENTION

1. Field of the Invention

This invention relates to the field of integrated circuits. More particularly, this invention relates to the communication of diagnostic signals to or from an integrated circuit.

2. Description of the Prior Art

It is known to provide integrated circuits with on-chip diagnostic capabilities. These capabilities can include debug, trace, calibration, configuration, production test and/or in-circuit programming. As integrated circuits increase in complexity, such as with the advent of system-on-chip designs, the provision of on-chip diagnostic mechanisms becomes increasingly useful and important.

A known technique for communicating diagnostic signals to and from an integrated circuit is to provide dedicated debug pins upon the integrated circuit package through which the diagnostic signals may pass. One example of such an arrangement would be the Test Access Port pins associated with JTAG debug.

An increasingly problem arising with integrated circuits are the limitations imposed by the integrated circuit packaging upon the number of pins provided. As the integrated circuits within the package increase in complexity, there is normally an increase in the required number of pins to communicate signals to and from the integrated circuit during normal functional operation. However, it is difficult to increase the number of pins provided by the package if space is limited and there is also a tendency to reduce the overall package size for cost or other reasons.

A characteristic of the diagnostic signals required for use in combination with an integrated circuit is that they typically are only used for a small proportion of devices or a small proportion of the life of a device. For example, debug capabilities may in practice normally only be used in debugging a few prototype devices and thereafter the production devices will not use the debug capabilities provided on-chip. Another example is integrated circuit calibration, configuration or in-circuit programming which would normally takes place upon manufacture and does not form part of the ongoing functional use of the integrated circuit by a user. The present technique recognises that valuable resources namely integrated circuit pins, are being dedicated to diagnostic uses when these uses are often one-time uses or never performed on a particular integrated circuit.

SUMMARY OF THE INVENTION

Viewed from one aspect the present invention provides an integrated circuit comprising:

at least one functional circuit operable to perform data processing operations using at least one functional signal;

at least one diagnostic circuit operable to perform diagnostic operations upon said at least one functional circuit using at least one diagnostic signal; and at least one integrated circuit pin coupled to said at least one functional circuit to provide a functional signal path for said at least one functional signal between said at least one functional unit and a functional device external of said integrated circuit; wherein said at least one integrated circuit pin is also coupled to said at least one diagnostic circuit to provide a diagnostic signal path for said diagnostic signal between said at least one diagnostic circuit and a diagnostic device external of said integrated circuit; and said diagnostic signal has a form relative to said functional signal such that communication of said functional signal via said at least one integrated circuit pin continues whilst communication of said diagnostic signal via said at least one integrated circuit pin is also performed.

The present technique overloads the diagnostic signal onto the functional signal being communicated through one or more common integrated circuit pins. The technique recognises that the differences in the communication requirements of the functional circuits with their functional signal and the diagnostic circuits with their diagnostic signal are such that it is possible to pass both simultaneously through a common integrated circuit pin in a manner that does not interfere with at least the functional operation of the integrated circuit. As an example, the bandwidth required by the functional and diagnostic signals may be very different enabling non-interfering physical communication channels to be simultaneously established via a common integrated circuit pin and for those signals to be simultaneously communicated. It will be appreciated that the use of the functional signal by the functional circuit and use of the diagnostic signal by the diagnostic circuit encompasses both generating and/or receiving those signals, with combination and/or separation as required.

It will be appreciated that the functional signal and the diagnostic signal can be combined and separated in a wide variety of different ways depending upon the relative nature of those two signals. However, particularly preferred techniques include: the diagnostic signal being formed by phase modulating the functional signal; the diagnostic signal being formed by frequency modulating the functional signal; the diagnostic signal being formed by amplitude modulating the functional signal; the diagnostic signal being formed by modulating timing characteristics of the functional signal; the diagnostic signal being formed by modulating a voltage offset of the function signal; and/or the diagnostic signal being formed by forcing an analog functional signal outside its normal range for a brief period of time. It will be appreciated by those in this technical field that other ways of combining the functional signal and the diagnostic signal such that they can be simultaneously communicated via a common pin are also possible depending upon the relative characteristics of the signals concerned.

The diagnostic circuit and the diagnostic signal can have a wide variety of different forms and uses. Included within these uses are integrated circuit debug; integrated circuit trace; integrated circuit calibration; integrated circuit configuration; integrated circuit production test; and/or in-circuit programming of an integrated circuit. It will be appreciated that further forms of diagnostic circuit and diagnostic signal are possible, these generally sharing the characteristic that they are required for use in respect of a small proportion of devices or for a small part of the lifetime of the integrated circuit.

The integrated circuit pin through which the functional signal and the diagnostic signal are passed may be any of the pins provided. However, use of the clock signal pin is particularly preferred as this is well suited to having the diagnostic signal combined therewith.

As previously mentioned the functional signal and the diagnostic signal to be communicated together can have a wide variety of forms and may respectively be inputs to the integrated circuit, outputs from the integrated circuit, bidirectional signals and mixtures thereof.

Viewed from another aspect the present invention provides a diagnostic interface circuit for connecting to an integrated circuit, said diagnostic interface circuit comprising:

at least one diagnostic signal connection for a diagnostic signal to be communicated with at least one diagnostic circuit within said integrated circuit for use in diagnostic processing operations; and a diagnostic signal communication circuit coupled to said at least one diagnostic signal connection and at least one integrated circuit pin of said integrated circuit, said at least one integrated circuit pin bearing both a functional signal for use with at least one functional circuit within said integrated circuit and said diagnostic signal, and said diagnostic signal communication circuit providing communication with said diagnostic signal; wherein said diagnostic signal has a form relative to said functional signal and said signal mixing circuit is operable such that communication of said functional signal via said at least one integrated circuit pin continues whilst communication of said diagnostic signal via said at least one integrated circuit pin is also performed.

A complementary aspect of the present technique is that a diagnostic interface circuit is provided which is capable of isolating the diagnostic signal from the functional signal (or combining in) such that it can be read from the integrated circuit, written to the integrated circuit or both. The diagnostic interface circuit may be able to perform all of the diagnostic processing itself or may simply act as an interface to another piece of diagnostic hardware, such as a general purpose computer running debug, trace, or other software.

A further aspect of the present technique is a signal mixing circuit for use within an integrated circuit, said signal mixing circuit comprising:

a clock signal input for coupling to a functional clock signal within said integrated circuit;

a diagnostic signal input for coupling to a diagnostic signal generated by a diagnostic circuit within said integrated circuit; and a mixing circuit operable to phase modulate said functional clock signal with said diagnostic signal to generate a phase modulated output signal carrying both said functional clock signal and said diagnostic signal.

The provision of an appropriate circuit/cell within the integrated circuit for receiving a clock signal and a diagnostic signal and mixing these together such that they are communicated together, such as to an output pin, is a particularly preferred way of providing the current technique. Similar cells suitable for dedicated inputs or for bidirectional pins are also possible and are further aspects of the present invention.

In the context of current integrated circuit production techniques, it will be appreciated that one manifestation of the present technique as an object of commerce is a computer readable representation of the new circuits for implementing this technique, such as the signal mixing circuit. These computer readable definitions are used by computer controlled tools to generate the masks, fabrication system driving signals, definitions and other materials which are required or desirable in producing an integrated circuit.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
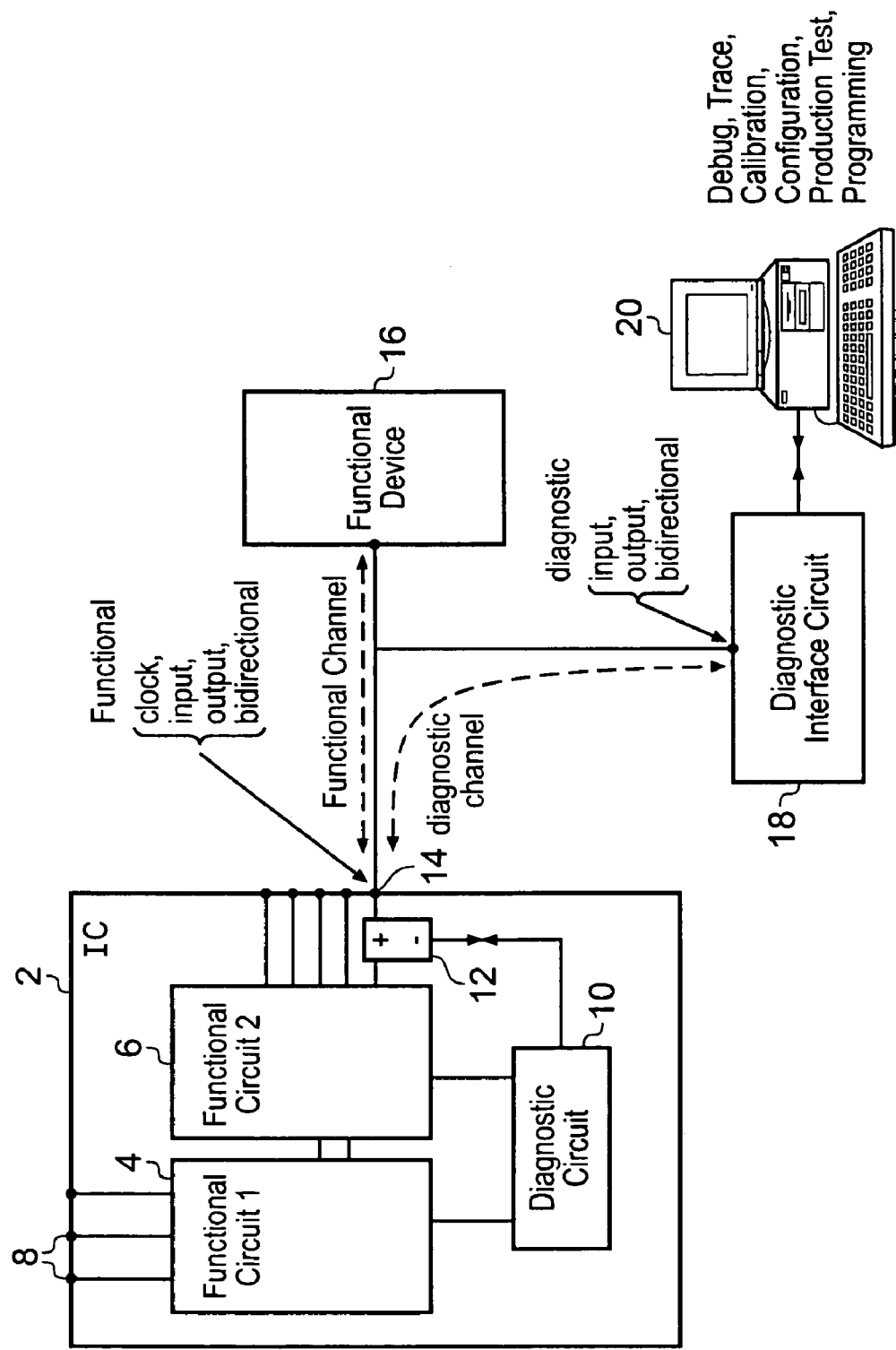
FIG. 1 schematically illustrates an integrated circuit in which both a diagnostic signal and a function signal are passed via a common integrated circuit pin.

FIG. 1 schematically illustrates an integrated circuit 2 comprising multiple functional circuits 4, 6 which have inputs, outputs and bidirectional signals passed via integrated circuit pins 8 in the packaging of the integrated circuit 2. Also included within the integrated circuit 2 is a diagnostic circuit 10 which performs diagnostic operations upon the functional circuits 4, 6, such as one or more of integrated circuit debug, integrated circuit trace, integrated circuit calibration, integrated circuit configuration, integrated circuit production test and in-circuit programming of integrated circuits. Further diagnostic operations may also be possible. The diagnostic circuit 10 is coupled to the functional circuits 4, 6 as well as to a signal mixing circuit 12. A diagnostic signal being output from the diagnostic circuit 10 is passed to the signal mixing circuit 12 where it is subject to one of a variety of techniques, such as various modulation techniques, to combine it with a functional signal being passed out of the integrated circuit 2 from the function circuit 6 via a shared integrated circuit pin 14. The functional signal is passed to an external functional device 16 (which may be part of the same product or an external product) so as to support the normal operation of the system. A physical communication channel is thus provided for the functional signal to pass from the functional circuit 6 to the functional device 16. The diagnostic signal which also passes through the shared integrated circuit pin 14 is used by a diagnostic interface circuit 18 and accordingly a physical communication channel for the diagnostic signal is provided from the diagnostic circuit 10, via the mixing circuit 12 and the shared integrated circuit pin 14 to the diagnostic interface circuit 18. A general purpose computer 20 is used to perform further processing upon the diagnostic signals received and isolated by the diagnostic interface circuit 18, such as to support one or more of debug, trace, calibration, configuration, production test and programming.

The functional signal and the diagnostic signal pass along their respective physical communication channels and the superimposing (overloading) of the diagnostic signal on the functional signal is transparent to at least the function circuit 6 and the functional device 16. Thus, when the diagnostic capability is not required, diagnostic signal generation by the diagnostic circuit 10 may be switched off or any diagnostic signal produced may be ignored. The diagnostic interface circuit 18 is normally only be used when working on prototype devices, or at manufacture, but would not be in place during the normal use of the integrated circuit 2 and the functional device 16 by an end user.

Figure 2:
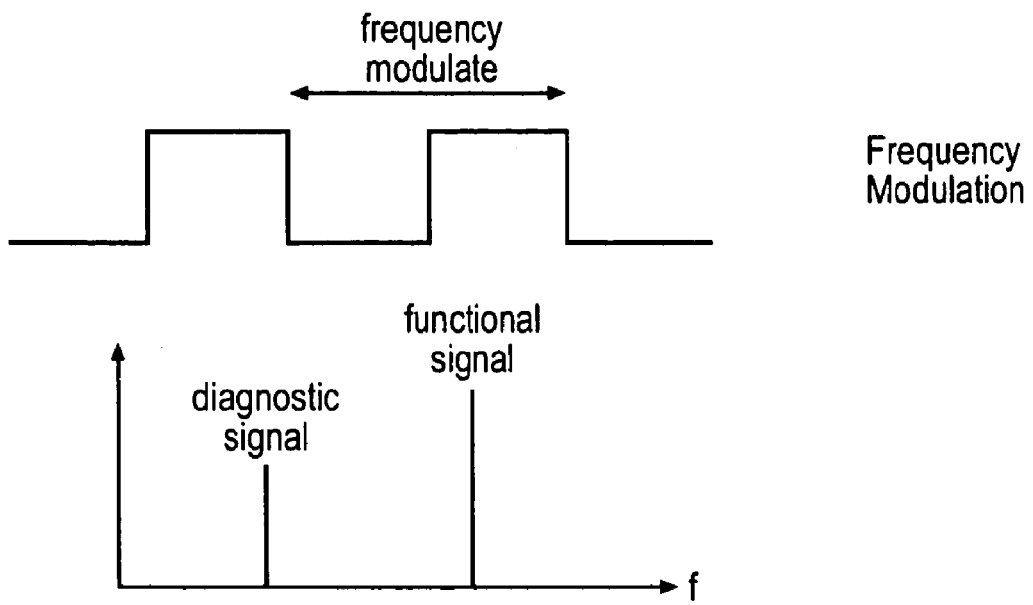
FIG. 2 illustrates combining the diagnostic signal and the functional signal by frequency modulation.

FIG. 2 schematically illustrates combining the diagnostic signal and the functional signal. In this case the diagnostic signal is used to frequency modulate a higher frequency functional signal. As an example, the function signal may be a clock signal operating at a high frequency and be subject to a relatively low frequency modulation of its frequency. The frequency spectrum of the combined signal is illustrated in the lower part of FIG. 2.

Figure 3:
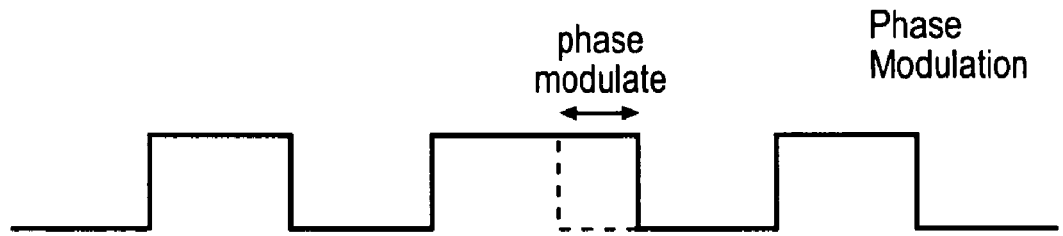
FIG. 3 illustrates combining the diagnostic signal and the functional signal by phase modulation.

FIG. 3 illustrates another technique whereby the diagnostic signal may be used to phase modulate the functional signal. Thus, in this example, a falling edge of the functional signal is delayed (i.e. a phase change introduced) in a way that can be detected by a diagnostic interface circuit 18 to recover the diagnostic signal but has no effect on the use of the functional signal being made by any functional circuits involved (e.g. these may be all edge triggered).

Figure 4:
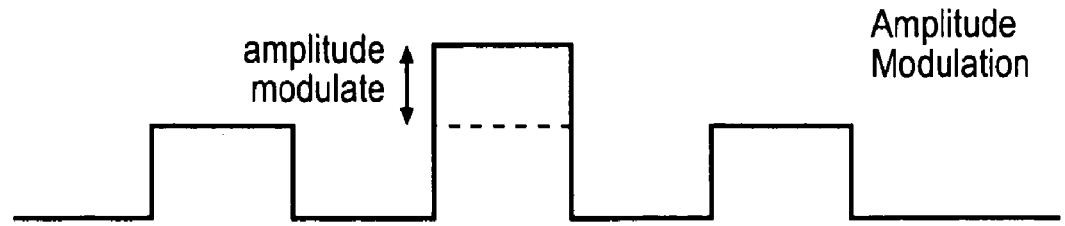
FIG. 4 illustrates combining the diagnostic signal and the functional signal by amplitude modulation.

FIG. 4 illustrates an embodiment in which the functional signal is amplitude modulated include the diagnostic signal. In integrated circuits many digital signals are not amplitude sensitive and accordingly such amplitude modulation is relatively readily used.

Figure 5:
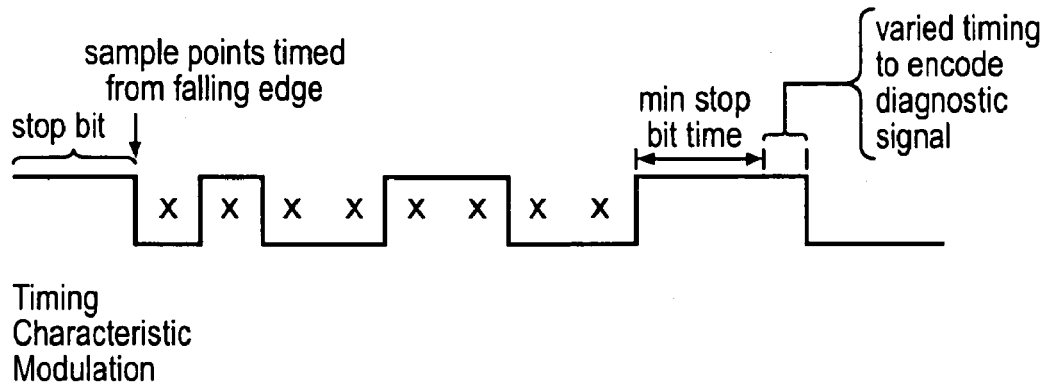
FIG. 5 illustrates combining the diagnostic signal and the functional signal by timing characteristic modulation.

FIG. 5 illustrates an example where a timing characteristic of a functional signal is modulated to pass a diagnostic signal. In this example, a serial data signal in which the falling edge of a stop bit defines eight sampling periods for functional data is illustrated. After the functional data has been passed, the stop bit is reasserted for a minimum period of time and the next falling edge of that stop bit defines the start of the next set of sampling periods. The precise timing of the falling edge of the stop bit following assertion association of the stop bit may be varied without interfering with the passage of the functional signal and accordingly may be used to pass the diagnostic signal. Thus, as well as the falling edge of the stop bit defining the start of the sampling periods for the functional signal, the timing of the falling edge of the stop bit relative to the rising edge of the stop bit can be used to encode the diagnostic signal. The timing of the edges of the data bits may also be varied to encode the diagnostic signal.

Figure 6:
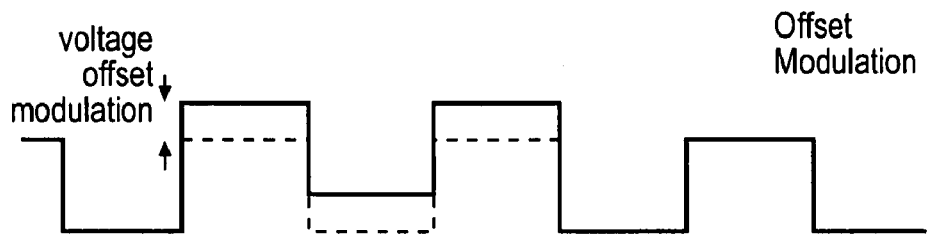
FIG. 6 illustrates combining the diagnostic signal and the functional signal by voltage offset modulation.

FIG. 6 illustrates an example technique whereby a voltage offset is applied to a functional signal to pass a diagnostic signal. As many functional signals within integrated circuits are edge sensitive, and not sensitive to an absolute level of voltage, applying offsets to the absolute level of voltage is a way in which diagnostic signal data may be communicated across a shared integrated circuit pin without interfering with the passage of the functional signal.

Figure 7:
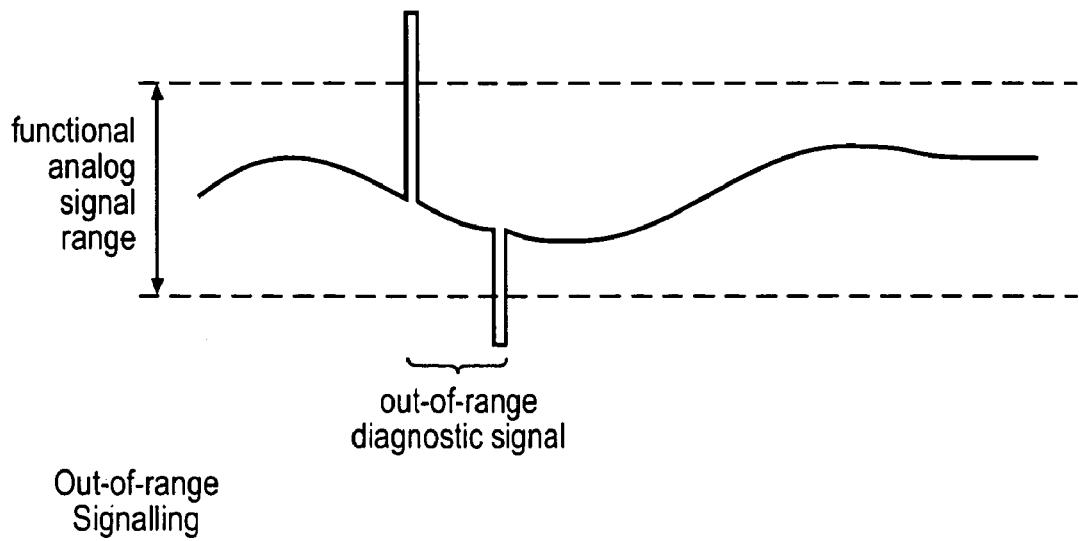
FIG. 7 illustrates combining the diagnostic signal and the functional signal using an out-of-range signal technique.

FIG. 7 illustrates an example in which the functional signal is an analog signal having a normal range of operation. The diagnostic signal can be combined with this analog signal by forcing the analog signal out-of-range for short periods of time which can be detected by a suitable diagnostic interface circuit 18. Providing the out-of-range periods are sufficiently small, they can be filtered from the functional analog signal and so have no effect upon the passing of the functional analog signal.

Figure 8:
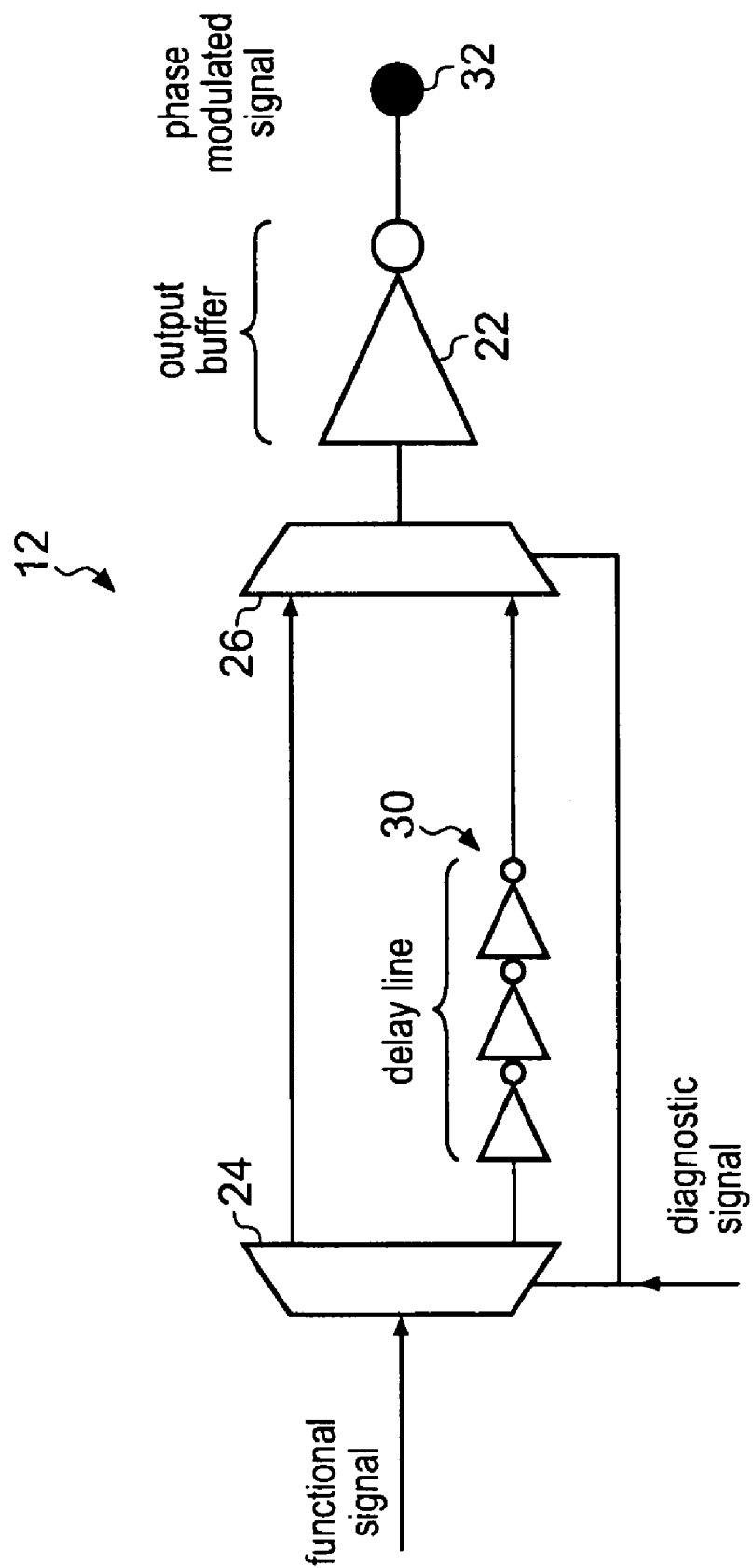
FIG. 8 illustrates a circuit for combining a functional signal and a diagnostic signal for output via a shared integrated circuit pin.

FIG. 8 schematically illustrates a signal mixing circuit in which a diagnostic signal can be combined with a functional signal using phase modulation. The functional signal is provided with two paths to an output buffer 22 which are respectively selected by multiplexers 24, 26 in dependence upon the diagnostic signal. One of these paths includes a delay line 30 which imposes a short delay corresponding to a phase shift in the functional signal. Thus, by selectively switching in and out the delay line 30, the functional signal being passed may be phase modulated by the inclusion and removal of a phase shift. The output from the output buffer 22 is passed to the shared integrated circuit pin 32.

Figure 9:
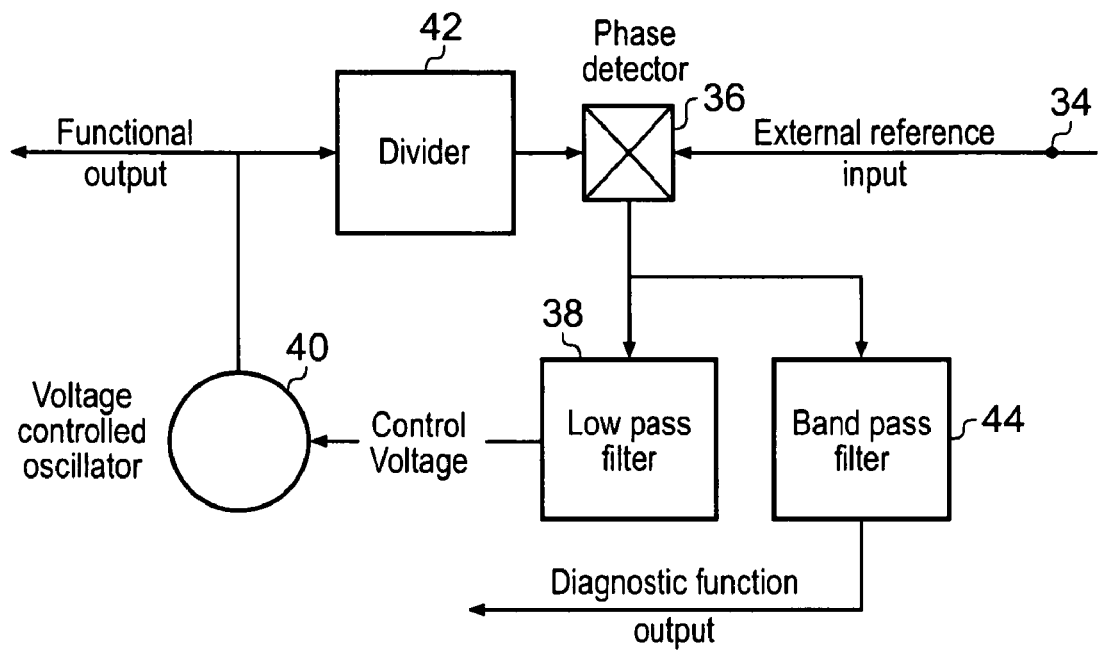
FIG. 9 illustrates a circuit for separating a diagnostic signal from a functional signal when these are received from a shared integrated circuit pin.

FIG. 9 illustrates a signal separating circuit in which an input signal at an integrated circuit input pin 34 carries an external reference functional signal (e.g. an external clock reference signal) which has been frequency modulated with a lower frequency diagnostic signal. In this example, the input from the integrated circuit pin 34 is fed to a phase detector 36, which forms part of a phase locked loop circuit including a low pass filter 38, a voltage controlled oscillator 40 and a divider 42. The divider 42 divides down the functional signal internal to the IC and the phase detector 36 detects when this deviates from the external reference functional signal. The error signals are low pass filtered by the low pass filter 38 to provide feedback control to the VCO 40. The modulation of the external reference functional signal with the diagnostic signal produces relatively high frequency error signals passed by the band pass filter 44 and blocked by the low pass filter 38 which serve as the diagnostic signal.

It will be appreciated that the example circuits of FIGS. 8 and 9 are simple examples of the special purpose circuits which can be provided associated with shared integrated circuit pins for passing input, output and/or bidirectional signals supporting simultaneous communication of a functional signal and a diagnostic signal. It is possible to envisage circumstances in which more than two signals would be simultaneously communicated via a shared integrated circuit pin, e.g. a clock signal which was subject to frequency modulation with a first diagnostic signal and voltage offset modulation with a second diagnostic signal. The diagnostic signals and the function signals can have characteristics sufficiently different that their simultaneous communication via a single integrated circuit pin would be practical.

The circuits of FIGS. 8 and 9 may also be used in the diagnostic interface 18 to provide the desire signal combination and signal separation.

It will be appreciated that integrated circuits can be specified and designed using standard libraries of circuit cells. ARM Physical IP Inc is one provider of libraries of such physical level circuit cells. The signal mixing (both combining and/or separating) circuits illustrated in FIGS. 8 and 9 may be provided as cells within such libraries and manifest themselves as computer readable definitions of such circuits which can be read and acted upon by other tools for higher level design, integrated circuit synthesis, manufacturing control and the like. Thus, a computer readable encoding/representation of the circuits of FIGS. 8 and 9 is one manifestation of those circuits. The particular data format used to represent those circuits could vary as will be appreciated by those skilled in this technical field.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:
1. An integrated circuit comprising:
   at least one functional circuit operable to perform data processing operations using at least one functional signal;
   at least one diagnostic circuit operable to perform diagnostic operations upon said at least one functional circuit using at least one diagnostic signal; and
   at least one integrated circuit pin coupled to said at least one functional circuit and configured to provide a functional signal path for said at least one functional signal between said at least one functional unit and a functional device external of said integrated circuit; wherein
   said at least one integrated circuit pin is also coupled to said at least one diagnostic circuit and configured to provide a diagnostic signal path for said diagnostic signal between said at least one diagnostic circuit and a diagnostic device external of said integrated circuit, said diagnostic device is separate from said functional device; and
   said diagnostic signal has a form relative to said functional signal, wherein communication of said functional signal via said at least one integrated circuit pin continues whilst communication of said diagnostic signal via said at least one integrated circuit pin is also performed.

2. An integrated circuit as claimed in claim 1, wherein said diagnostic signal is phase modulated with said functional signal.

3. An integrated circuit as claimed in claim 2, wherein said functional signal is a clock signal and said integrated circuit pin is a clock signal input pin.

4. An integrated circuit as claimed in claim 1, wherein said diagnostic signal is frequency modulated with said functional signal.

5. An integrated circuit as claimed in claim 4, wherein said functional signal is a clock signal and said integrated circuit pin is a clock signal input pin.

6. An integrated circuit as claimed in claim 1, wherein said diagnostic signal is amplitude modulated with said functional signal.

7. An integrated circuit as claimed in claim 1, wherein said functional signal is a digital signal having signal timing characteristics and said diagnostic signal modulates said timing characteristics of said digital signal.

8. An integrated circuit as claimed in claim 1, wherein said functional signal has a voltage offset and said diagnostic signal is modulated with said voltage offset of said functional signal.

9. An integrated circuit as claimed in claim 1, wherein said functional signal is an analog signal having a range of functional values and said diagnostic signal forces said analog signal to a value outside of said range for a time insufficient to substantially alter said functional signal being communicated.

10. An integrated circuit as claimed in claim 1, wherein said diagnostic circuit provides one or more of:
    (i) integrated circuit debug;
    (ii) integrated circuit trace;
    (iii) integrated circuit calibration;
    (iv) integrated circuit configuration;
    (v) integrated circuit production test; and
    (vi) in-circuit programming of an integrated circuit.

11. An integrated circuit as claimed in claim 1, wherein said functional signal is one of:
    (i) a functional input signal to said integrated circuit;
    (ii) a functional output signal from said integrated circuit; and
    (iii) a functional bidirectional signal to and from said integrated circuit.

12. An integrated circuit as claimed in claim 1, wherein said diagnostic signal is one of:
    (i) a diagnostic input signal to said integrated circuit;
    (ii) a diagnostic output signal from said integrated circuit; and
    (iii) a diagnostic bidirectional signal to and from said integrated circuit.

13. An integrated circuit comprising:
    at least one functional circuit for performing data processing operations using at least one functional signal;
    at least one diagnostic circuit for performing diagnostic operations upon said at least one functional circuit using at least one diagnostic signal; and
    at least one integrated circuit pin coupled to said at least one functional circuit and configured to provide a functional signal path for said at least one functional signal between said at least one functional unit and a functional device external of said integrated circuit; wherein
    said at least one integrated circuit pin is also coupled to said at least one diagnostic circuit and configured to provide a diagnostic signal path for said diagnostic signal between said at least one diagnostic circuit and a diagnostic device external of said integrated circuit, said diagnostic device is separate from said functional device; and
    said diagnostic signal has a form relative to said functional signal, wherein a physical communication channel for said functional signal and a physical communication channel for said diagnostic signal are provided simultaneously using said at least one integrated circuit pin.

14. An integrated circuit comprising:
    at least one functional circuit for performing data processing operations using at least one functional signal;
    at least one diagnostic circuit for performing diagnostic operations upon said at least one functional circuit using at least one diagnostic signal; and
    at least one integrated circuit pin coupled to said at least one functional circuit and configured to provide a functional signal path for said at least one functional signal between said at least one functional unit and a functional device external of said integrated circuit; wherein
    said at least one integrated circuit pin is also coupled to said at least one diagnostic circuit and configured to provide a diagnostic signal path for said diagnostic signal between said at least one diagnostic circuit and a diagnostic device external of said integrated circuit, said diagnostic device is separate from said functional device; and
    said diagnostic signal has a form relative to said functional signal, wherein said function signal and said diagnostic signal can be communicated simultaneously using said at least one integrated circuit pin.

15. A diagnostic interface circuit for connecting to an integrated circuit, said diagnostic interface circuit comprising:
    at least one diagnostic signal connection for providing a diagnostic signal to at least one diagnostic circuit within said integrated circuit for use in diagnostic processing operations; and
    a diagnostic signal communication circuit coupled to said at least one diagnostic signal connection and at least one integrated circuit pin of said integrated circuit, said at least one integrated circuit pin bearing both a functional signal for use with at least one functional circuit within said integrated circuit and said diagnostic signal, and said diagnostic signal communication circuit providing communication with said diagnostic signal, said functional signal is communicated between said at least one functional unit and a functional device external to said integrated circuit, and said functional device is separate from said diagnostic interface circuit; wherein said diagnostic signal has a form relative to said functional signal and communication of said functional signal via said at least one integrated circuit pin continues whilst communication of said diagnostic signal via said at least one integrated circuit pin is also performed.

16. A diagnostic interface circuit for connecting to an integrated circuit, said diagnostic interface circuit comprising:

at least one diagnostic signal connection for providing a diagnostic signal to at least one diagnostic circuit within said integrated circuit for use in diagnostic processing operations; and a diagnostic signal communication circuit coupled to said at least one diagnostic signal connection and at least one integrated circuit pin of said integrated circuit, said at least one integrated circuit pin bearing both a functional signal for use with at least one functional circuit within said integrated circuit and said diagnostic signal, and said diagnostic signal communication circuit providing communication with said diagnostic signal, said functional signal is communicated between said at least one functional unit and a functional device external to said integrated circuit, and said functional device is separate from said diagnostic interface circuit; wherein said diagnostic signal has a form relative to said functional signal and a physical communication channel for said functional signal and a physical communication channel for said diagnostic signal are provided simultaneously using said at least one integrated circuit pin.

17. A diagnostic interface circuit for connecting to an integrated circuit, said diagnostic interface circuit comprising:

at least one diagnostic signal connection for providing a diagnostic signal to at least one diagnostic circuit within said integrated circuit for use in diagnostic processing operations; and a diagnostic signal communication circuit coupled to said at least one diagnostic signal connection and at least one integrated circuit pin of said integrated circuit, said at least one integrated circuit pin bearing both a functional signal for use with at least one functional circuit within said integrated circuit and said diagnostic signal, and said diagnostic signal communication circuit providing communication with said diagnostic signal, said functional signal is communicated between said at least one functional unit and a functional device external to said integrated circuit, and said functional device is separate from said diagnostic interface circuit; wherein said diagnostic signal has a form relative to said functional signal and said function signal and said diagnostic signal can be communicated simultaneously using said at least one integrated circuit pin.

* * * * *